United States Patent
Beck

(10) Patent No.: US 6,876,213 B2
(45) Date of Patent: Apr. 5, 2005

(54) COMPLIANT ACTUATOR FOR IC TEST FIXTURES

(75) Inventor: John P. Beck, Savage, MN (US)

(73) Assignee: JohnsTech International Corporation, Minneapolis, MN (US)

( * ) Notice: Subject to any disclaimer, the term of this patent is extended or adjusted under 35 U.S.C. 154(b) by 0 days.

(21) Appl. No.: 10/368,100

(22) Filed: Feb. 18, 2003

(65) Prior Publication Data

US 2003/0179009 A1 Sep. 25, 2003

Related U.S. Application Data

(60) Provisional application No. 60/358,950, filed on Feb. 22, 2002.

(51) Int. Cl.$^7$ ............................................. G01R 31/02
(52) U.S. Cl. ........................................ 324/755; 324/754
(58) Field of Search ................................ 324/754, 755, 324/158.1, 758, 760

(56) References Cited

U.S. PATENT DOCUMENTS

| | | | |
|---|---|---|---|
| 2,865,205 A | * 12/1958 | Lear et al. ................ | 74/5.6 E |
| 4,055,992 A | 11/1977 | Pizzarello .................. | 73/88 |
| 4,318,522 A | * 3/1982 | Appleberry .............. | 248/179.1 |
| 4,560,216 A | * 12/1985 | Egawa ........................ | 439/41 |
| 5,205,742 A | * 4/1993 | Goff et al. .................. | 439/73 |
| 5,336,094 A | 8/1994 | Johnson ..................... | 439/62 |
| 5,360,348 A | 11/1994 | Johnson ..................... | 439/72 |
| 5,367,253 A | * 11/1994 | Wood et al. .............. | 324/158.1 |
| 5,408,190 A | * 4/1995 | Wood et al. .............. | 324/765 |
| 5,639,247 A | 6/1997 | Johnson et al. ............ | 439/74 |
| 5,645,433 A | 7/1997 | Johnson ..................... | 439/66 |
| 5,749,738 A | 5/1998 | Johnson et al. ............ | 439/66 |
| 5,926,027 A | 7/1999 | Bumb, Jr. et al. ......... | 324/755 |
| 5,947,749 A | 9/1999 | Rathburn ................... | 439/66 |
| 5,967,848 A | 10/1999 | Johnson et al. ............ | 439/620 |
| 6,040,702 A | 3/2000 | Hembree et al. .......... | 324/755 |
| 6,064,218 A | 5/2000 | Godfrey et al. ............ | 324/762 |
| 6,181,149 B1 | 1/2001 | Godfrey et al. ............ | 324/761 |
| 6,229,322 B1 | 5/2001 | Hembree .................... | 324/755 |

* cited by examiner

Primary Examiner—Ernest Karlsen
(74) Attorney, Agent, or Firm—Nawrocki, Rooney & Sivertson, P.A.

(57) ABSTRACT

An actuator for use in an IC package test fixture has a base element and a float. The float is attached to the base element with a gimbaled mount. At least one resilient element such as a compression spring biases the float away from the base element and against a retainer. The float has a presser surface for pressing against an IC package surface opposite the IC package contacts, to thereby force the contacts of the IC package against test contacts. The float's gimbaled mount in one embodiment provides up to two rotational degrees of freedom and one translational degree of freedom in the motion of the float. The resilient element provides a predetermined preload force at the presser surface.

12 Claims, 4 Drawing Sheets

COMPLIANT ACTUATOR FOR IC TEST FIXTURES

This is a regular application filed under 35 U.S.C. §111(a) claiming priority under 35 U.S.C. §119(e) (1), of provisional application Ser. No. 60/358,950, filed Feb. 22, 2002 under 35 U.S.C. §111(b).

TECHNICAL FIELD

The present invention relates to integrated circuit test devices, more particularly to a compliant actuator for test fixtures for ball grid array and other IC packages.

BACKGROUND OF INVENTION

A number of different types of packages for integrated circuits (ICs) have been developed over the years. The term "package" in this context means the enclosure or container that houses and protects the actual microelectronic circuitry. An IC package has external contacts or terminals that are internally connected to the various terminals of the IC itself. During assembly, the external IC package contacts are connected in some way to properly aligned contacts on a circuit board.

The IC contact connection can be done in a number of different ways. One way is through use of sockets in which the IC package mounts. Another, and the one with which this invention is concerned, is by directly bonding the IC package to terminals on the circuit board. The bonding process must provide secure mechanical attachment and good electrical connection between each package terminal and the circuit board contacts. Soldering is one common type of bonding used, but other techniques such as ultrasonic bonding are also used.

Solder bonding is often done by forming solder-coated contacts on the IC. The circuit board on which the IC is mounted has a set of contacts designed to align with the IC package contacts. The IC is then temporarily held with all of its contacts positioned against the corresponding circuit board contacts. By heating the solder on the contacts, for example with an infrared beam, the IC is electrically and mechanically attached to the circuit board.

FIG. 1 shows an IC package 10 called a "ball grid array" package that is frequently used now for solder bonding. In ball grid array packaging, an orthogonal grid of solder ball contacts 14 is formed on a flat surface 16 of the IC package exterior 12. The individual solder contacts forming grid 14 may be spaced by approximately 1 mm. from their orthogonal neighbors with anywhere from 5 to 50 contacts on one edge of the grid. Referring to FIG. 3, package 10 has a top surface 11 opposite the side carrying the contacts 14.

The package 10 is attached to the circuit board by pressing the solder ball contacts 14 against the corresponding circuit board contacts. The opposite side of the circuit board is then heated to a temperature sufficient to melt the solder contacts 14 on the IC package but not so hot that either the IC or the circuit board itself is damaged. The individual solder balls bond to the adjacent circuit board contacts, electrically and mechanically attaching IC package 10 to the circuit board.

As is well known, testing of individual ICs is an important part of IC and circuit board manufacturing. Even though IC manufacturing consistently produces a relatively low percentage of defective parts, it is usual to test most ICs and other components before installing. Ball grid array packages and most other types of ICs as well are for all practical purposes permanently mounted once soldered to a circuit board. Since it is difficult or impossible to replace the defective part, installing a defective IC or other component usually ruins the entire circuit board. For this reason it is usually cost-effective to test ICs before soldering them permanently onto the circuit board.

This testing can be done by both manual and automated test equipment. Typically, tests are carried out by mounting the IC in a test fixture having contacts that temporarily connect the IC package contacts to test equipment without soldering. Such an arrangement is shown in U.S. Pat. No. 5,360,348. The test equipment applies test signals and power to the IC through the contacts in the test fixture and receives output signals from the IC through the test fixture contacts. The test equipment can then check in the conventional way that specific sets of input signals to the IC cause the IC to provide predetermined output signals.

Test fixtures are often used for production testing of large numbers of IC devices. Extended life contacts are important in such test fixtures because the cost of the socket can be amortized over the production of a large number of IC devices. Extended life sockets also reduce down time required to maintain or replace the sockets.

When testing an IC device, good electrical contact to the IC leads is important for determining how well an IC functions. Measurements while testing an IC device ideally reflect only the part performance. That is, the test environment should not affect the outcome of the test procedure. I find that the contacts in the test fixture can on occasion affect measurements of the IC performance and even the actual performance of the IC itself.

Characteristics of a test fixture that determines its ability to effectively test IC performance include electrical contact reliability, electrical performance, thermal effects, and mechanical performance. These factors should be taken into account when designing a text fixture.

Two main factors impact the ability of the socket to establish reliable contact. The test fixture contacts must penetrate any contaminants on the IC leads, and the IC mounting in the test fixture must deal with lack of lead coplanarity. Test fixture contacts should form low resistance electrical connections with corresponding contacts of the IC to be tested. One design achieves this result by providing a "wiping" action or connection in which the lead to be contacted slides past, and is gently "roughened" by the socket contact, thereby breaking through contaminants carried thereon.

As to the issue of lack of coplanarity, it is necessary that there be compliance or flexibility somewhere in the test system so that the IC contacts and the test fixture contacts conform in a way that creates good electrical connection between each pair of contacts. Furthermore, compliance is advantageous since IC package irregularities, including non-parallel conditions and thickness variations, are not uncommon.

An actuator is a device that provides the force for creating the desired electrical contact between the test socket contacts and the IC leads. Actuators exist that have compliant members depending therefrom. Such compliant members may comprise deformable or otherwise resilient elastomeric bumpers or tabs (see for example U.S. Pat. No. 5,926,027 wherein such compliant elements are adhesively affixed for device alignment and engagement). But such actuators do not always provide optimal mechanical performance. Furthermore, these actuator designs may not transfer to test fixtures for ball grid array IC packages.

I find that using standard actuators to press ball grid arrays against an array of test contacts is sometimes not successful.

Apparently the electrical characteristics of the contacts, such as resistance, are not consistent from one contact to the next, and from one test operation to the next. These variations may occasionally lead to rejection of some IC's that are actually good. In other cases, the test procedure returns inconsistent or indeterminate results as contact resistances change during the test activity.

Thus there remains a need to provide a compliant actuator that reliably applies contact-creating forces to a device under test. Such an actuator should perform repeatedly and reliably in compensating for device package irregularities and non-coplanarity between the actuator and contactor, under temperature extremes and mechanical rigor.

SUMMARY OF THE INVENTION

I have developed an actuator that can during pre-installation testing, provide consistent and constant contact resistance while compensating and adjusting for irregularities and lack of coplanarity in IC packages. The actuator also can provide a predetermined and relatively constant amount of force for pressing the contacts of an IC package against test fixture contacts.

Such an actuator is designed to form a part of an IC test fixture for compliantly pressing an IC package having a predetermined geometry against a test plane. The actuator itself includes a base element and a float. The float is carried by the base element and is gimbaled with respect thereto. The float has a presser surface thereon facing away from the base plate. The presser surface is shaped to conform to a predetermined feature of the IC package geometry. At least one resilient element urges the float away from the actuator base element and cooperates to provide the gimbaled mount for the float.

This actuator is well suited for use in a test fixture intended for handling ball grid array types of IC packages.

More specific features and advantages will become apparent with reference to the DETAILED DESCRIPTION OF THE INVENTION, appended claims, and the accompanying drawing figures.

BRIEF DESCRIPTION OF THE DRAWINGS

FIG. 3 shows the opened test fixture with the actuator assembled and mounted in the test fixture.

DETAILED DESCRIPTION OF THE INVENTION

Figure 1:
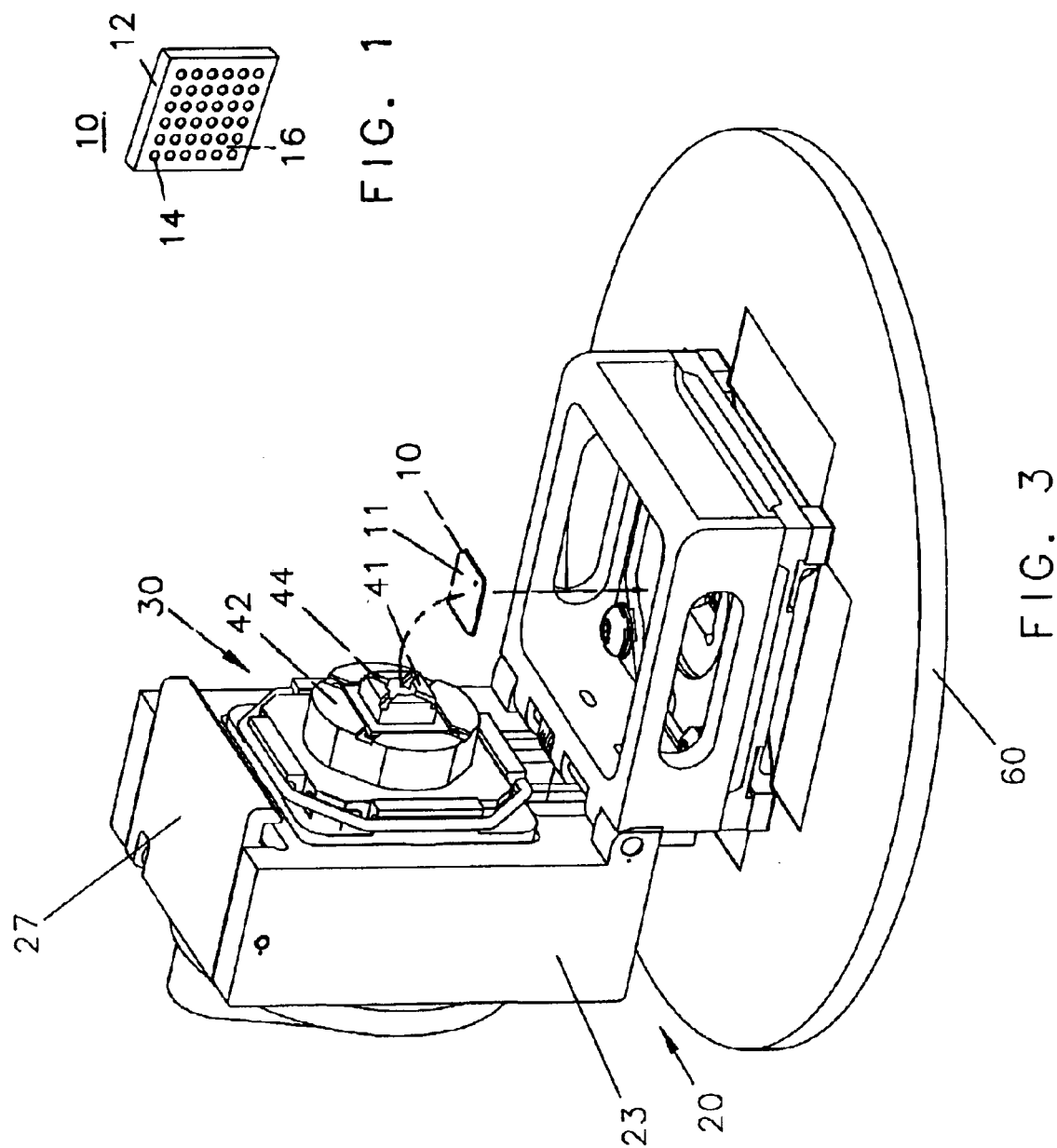
FIG. 1 illustrates a sample integrated circuit package suitable for use with the compliant actuator of the subject invention.
Figure 2:
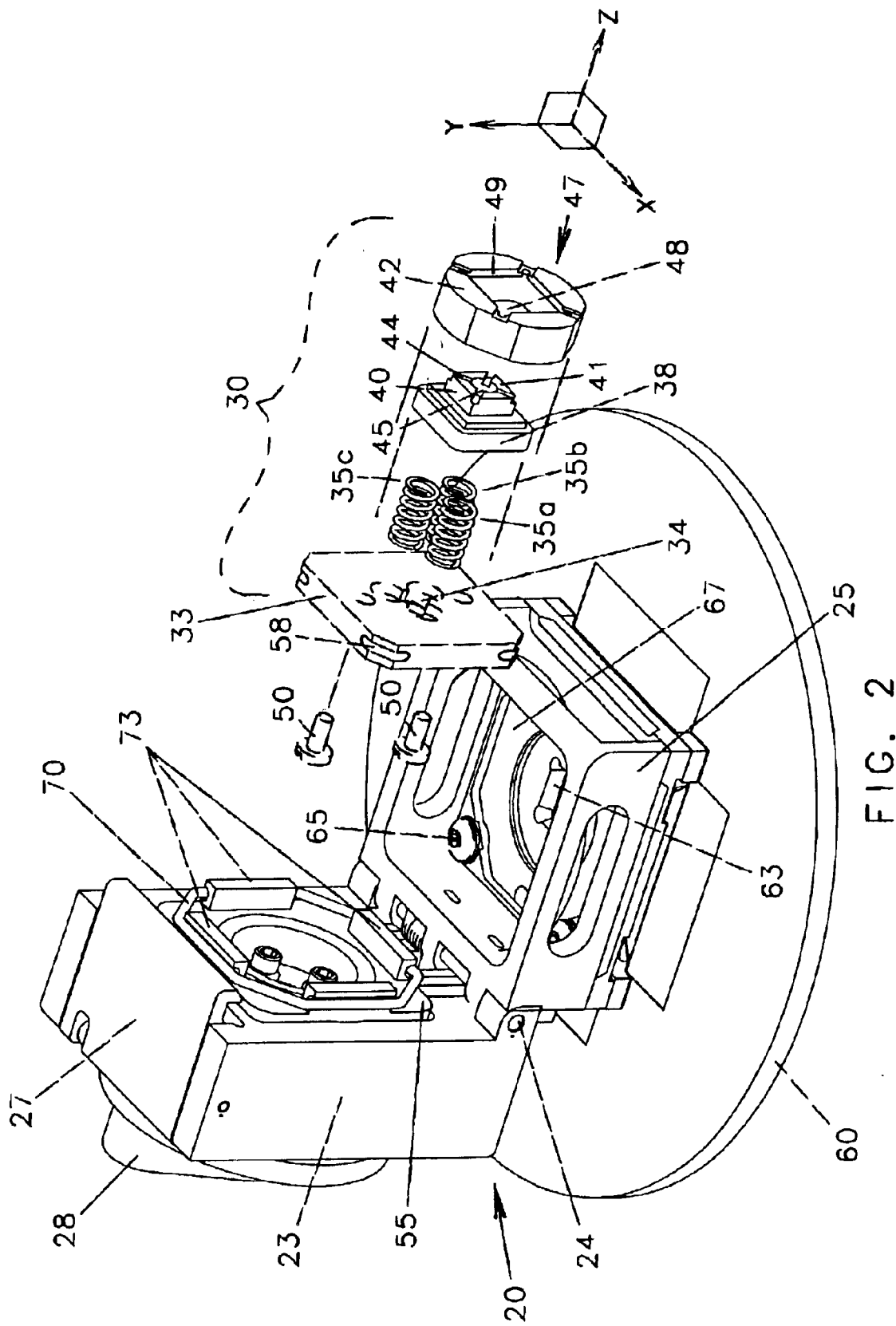
FIG. 2 is a perspective view of an opened test fixture with the actuator of the invention in exploded view.

Refer now to the drawing figures wherein like reference numerals denote like elements throughout the several views. FIGS. 2 and 3 show a test fixture 20 of which an actuator 30 forms a part. Test fixture 20 forms a part of a test system for testing a device such as a semiconductor or integrated circuit package 10.

Test fixture 20 includes a hollow base 25 by which test fixture 20 can be mounted on a circuit board 60. A swivel pin 24 mounts lid 23 for rotation on base 25. Lid 23 can be rotated on pin 24 into a closed position covering base 25. A latch 27 locks lid 23 in the closed position on base 25. Various functions of lid 23 and actuator 30 will be described with reference to the X, Y, and Z axes shown in FIG. 2.

Fixture 20 includes a press 55 for carrying and deploying actuator 30. Rotating knob 28 advances and retracts press 55 in lid 23 along the Z axis using some sort of linkage or mechanism such as a screw thread. Knob 28 when acting through the linkage or mechanism should be able to develop a substantial amount of force in advancing press 55, perhaps as much as 100 kg.

Actuator 30 need not be carried or supported by lid 23 although this is convenient. Actuator 30 may be adapted for use with known test fixtures and with known IC packages different from that shown here. Such adaptation is well within the skill of an ordinary artisan in this field.

FIG. 2 shows the compliant actuator 30 of the subject invention in exploded view as including a base element 33 and a float 38. Float 38 is supported by base element 33 via a mechanical linkage that creates a gimbaled mount for float 38 relative to base element 33. Base element 33 has a central bore 34. Float 38 has a central bore 45 in approximate alignment with bore 34. Bores 34 and 45 permit cooling air supplied by a fan or blower to pass to an IC package 10 undergoing testing.

A "gimbaled mount" for float 38 in this context means that the mount has at least one degree of rotational freedom for float 38 relative to base element 33. The term "degree of freedom" in this context means the ability of a body to translate along one of the three orthogonal X, Y, or Z axes shown (a translational degree of freedom) or to rotate about one of these three orthogonal axes (a rotational degree of freedom). The gimbaled mount of float 38 arises from the interaction of float 38, a retainer 47 carried on base element 33, and coil springs 35a, 35, 35c.

In the embodiment shown in FIGS. 2 and 3, float 38 has three degrees of freedom relative to base element 33. However, particular situations may allow for anywhere from one to six degrees of freedom.

Figure 6:
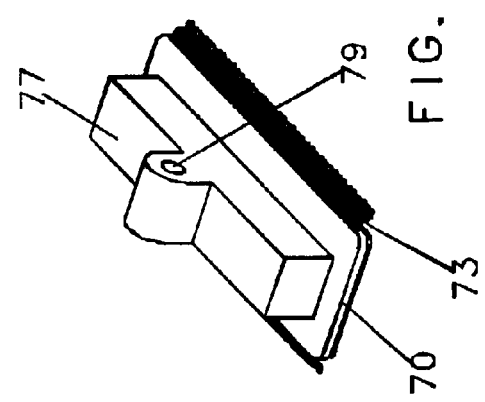
FIG. 6 shows an adaptation of the invention to SO (small outline) package devices.

Slight rotations of float 38 about axes parallel to the X and Y axes shown, provide two degrees of rotational freedom. Slight translational motion of float 38 relative to base element 33 and parallel to the Z axis provides a third degree of freedom. Three degrees of freedom are shown in the preferred embodiment here, but more or less than three degrees of freedom may be suitable for different test fixtures and different types of IC packages. In fact, FIG. 6 shows a system for which a single degree of rotational freedom may be sufficient.

Float 38 is held in an initial extended position (FIG. 4) by cooperation between springs 35a, 35b, 35c and retainer 47. Machine screws 50 extend through holes in base element 33 and thread into tapped holes in retainer 47 to securely attach retainer 47 to base element 33. Certainly other designs for retaining float 38 to a selected range of motion are also possible.

Referring to FIG. 2, retainer 47 has an opening 48 through which a projection 40 of float 38 extends. The internal edges of the opening in retainer 47 as at 49 interferingly contact peripheral edges of float 38 (adjacent to the projection 40) so as to retain float 38 between base element 33 and retainer 47 in the initial extended position when not deployed to press on an IC package 10.

Projection 40 has a presser surface 41 on the end thereof and facing away from base element 33. Presser surface 41 is to come into actual contact with top surface 11 of IC package 10 when actuator 30 is deployed to force a grid 14 of an IC package 10 against the bottom of a well or recess 63. As will be explained in more detail below, contacts in the floor of well 63 can in this way connect electrically to contacts of grid 14.

Springs 35a, 35b, 35c should have an uncompressed length that results in some compression by the act of assembling float 38. Float 38 is held by retainer 47 in the initial extended position shown FIG. 4 by springs 35a, 35b, 35c which press float 38 against retainer 47. The initial compression of springs 35a, 35b, 35c results in some preload or preengagement force urging float 38 against retainer 47.

One can see then, that when float 38 is in the initial extended position, a predetermined preload force is needed to overcome the force of springs 35a, 35b, 35c and release float 38 from retainer 47. Force in excess of the preload force applied to presser face 41 on projection 40 overcomes the preload force provided by springs 35a, 35b, 35c and releases float 38 from retainer 47. Float 38 is freed in this manner to rotate about X and Y axes and translate in the Z axis to thereby create the gimbaled mount for float 38.

Springs 35a, 35b, 35c must be selected to provide the desired preload force of float 38 against retainer 47. The preload and the spring rate for the springs 35a, 35b, 35c should be selected to provide force against top surface 11 that is within the desired range when compressed during deployment of actuator 30.

Actuator 30 is to be mounted by base element 33 on press 55 of the test fixture lid 23. In one embodiment, base element 33 has slotted corners 58 that form a part of a mounting mechanism. An elastic band or O-ring 70 is stretched around tabs 73 projecting from press 55. Band 70 engages the slotted corners 58 to retain actuator 30 on the press 55. At the same time, actuator 30 can be easily removed and replaced simply by flexing and stretching band 70.

Surface 41 has one or more channels 44 leading away from central bore 45. Channels 44 allow cooling air flowing through bores 34 and 45 to contact top surface 11 and cool IC package 10 while a test is occurring. Presser surface 41 has a conforming shape with the geometry of at least one predetermined feature of the IC package 10.

"Conforming shape" means in this context and for a ball grid array IC package, that the presser surface 41 matches the top surface 11 of the chip package 10 in a way that permits force to be transmitted from surface 41 relatively evenly across top surface 11. Typically, this means that surface 11 shape is substantially the converse of surface 41. In the majority of cases, surface 11 is flat or nearly so, so then surface 41 should also be flat.

Surface 41 will typically make a substantial number of point contacts across the surface 11 due to normal variations in the profile of top, surface 11. Surface 41 may be deliberately designed to have a number of small projections for contact with surface 11, but this profile is relatively difficult to produce, and usually unnecessary.

"Conforming shape" may also mean that the periphery of the presser surface 41 extends to at least nearly align along the Z axis with all of the contacts on the periphery of the grid 14. Presser surface 41 is preferably shaped to apply force to top surface 11 in a way that allows that force to transfer relatively evenly to all of the individual contacts forming grid 14.

The base 25 of test fixture 20 is to be firmly mounted on a circuit board 60 by fasteners such as machine screw 65.

Figure 4:
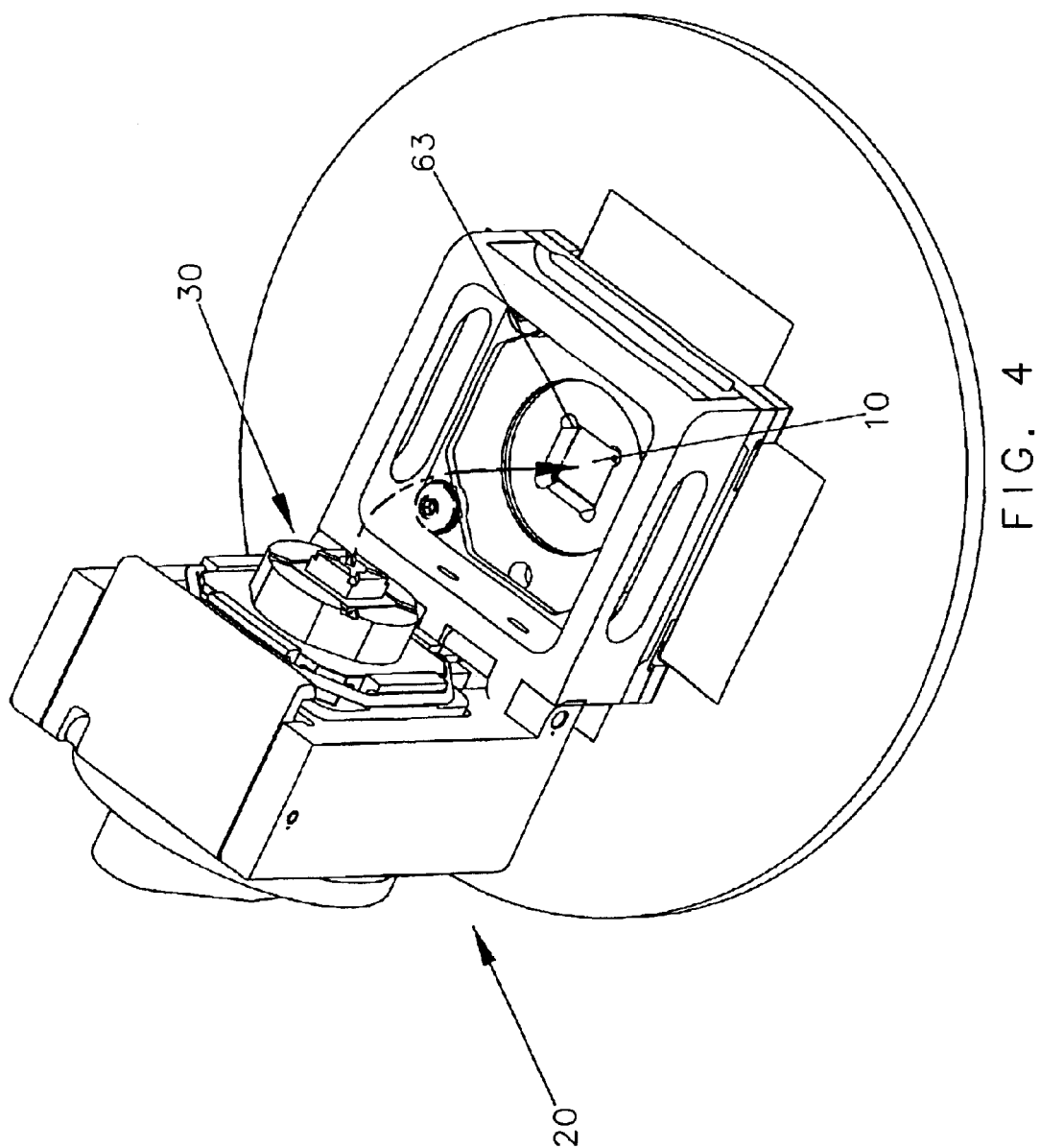
FIG. 4 shows the open test fixture with the integrated circuit package placed in its testing position.

Well 63 is sized to receive IC package 10 as shown in FIG. 4. A floor of well 63 carries an array of test contacts positioned to align and electrically connect with the contacts forming grid 14. Preferably, the test contacts are plated with gold or a precious metal alloy to reduce contact resistance. The floor of well 63 should be designed to resist perhaps as much as 100 kg. of force with only minimal deflection. Some resilience for the contacts in the floor of well 63 is desirable to accommodate deviations from coplanarity in the contacts of grid 14. Conductors (not shown) will lead from the test contacts to electrical test equipment that provides a functional use test for an IC package 10 mounted for testing within well 63.

Figure 5:
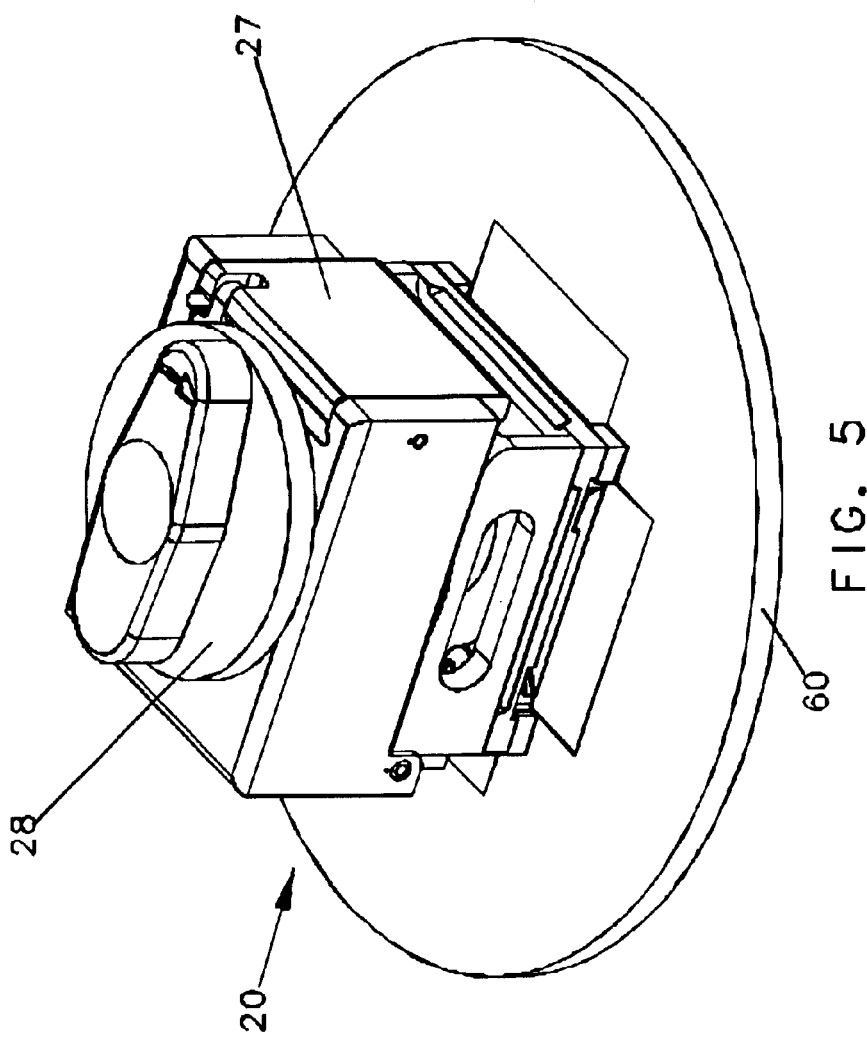
FIG. 5 shows the closed test fixture.

To use test fixture 30, an IC package 10 is placed within well 63. Lid 23 is swung into the position shown in FIG. 5 with latch 27 locking lid 23 closed. Preferably, actuator 30 can be retracted sufficiently so that a slight gap exists between presser surface 41 and top surface 11 when actuator 30 is fully retracted as shown in FIG. 3. Once lid 23 is closed, knob 28 is rotated to advance press 55. Actuator 30 shifts toward IC package 10. Presser surface 41 contacts the top surface 11 of IC package 10. Further knob 28 rotation further advances press 55 overcoming the preload force and compressing springs 35a, 35b, 35c further against float 38. The compression of springs 35a, 35b, 35c forces each of the grid 14 contacts into contact with the test contacts in the floor of well 63.

A stop of some type should be provided to prevent presser 55 from advancing actuator 30 so far that float 38 bottoms out on base element 33. In the design shown, a stop surface 42 on retainer 47 will eventually contact surface 67 surrounding well 63 as press 55 advances. This contact establishes a hard stop limiting the maximum advance of press 55 along the Z axis. Stop surface 42 should contact surface 67 before float 38 bottoms out on base element 33. This relationship preserves the gimbaled mount of float 38 during operation.

When lid 23 is closed with press 55 in the maximum retracted position, the internal structure of test fixture 20 should provide for a slight gap between presser surface 41 and top surface 11. I believe that presser surface 41 engages top surface 11 more consistently with this structure.

The characteristics of springs 35a, 35b, 35c and retainer 74 should be chosen to provide a predetermined preload or preengagement force $F_p$, i.e. the force applied by springs 35a, 35b, 35c before presser surface 41 contacts top surface 14. The characteristics of springs 35a, 35b, 35c that can be controlled to provide a predetermined $F_p$ are unstressed length, spring rate, and compressed length. Most conveniently, these spring characteristics are chosen such that actual or total spring force $F_t$ applied to IC package 10 while float 38 moves in the allowed degrees of freedom provided, varies little from $F_p$. This situation allows for easy control of the total force $F_t$ applied to top surface 11 by float 38.

$F_t$ is an important parameter for this device. $F_t$ is essentially the amount of force applied directly to IC package 10, and therefore is an important factor in the amount of force applied to each of the contacts in grid 14. I find that the amount of force applied to each of the contacts in grid 14 should normally be in the range of 20–60 gm. For typical solder contacts, the force per contact should be in the range of 30–40 gm.

The value for $F_t$ should be low enough to avoid damage to IC package 10 or the contacts forming grid 14. On the other hand, $F_t$ should be high enough to assure consistent and adequate force on each and every one of the contacts forming grid 14. Force on an individual contact should not cause a contact of grid 14 to deform.

Force on each grid 14 contact must be sufficient to form a low resistance contact with the associated test contact. High resistance in a power contact may cause inadequate power or rapid heating at the junction that may melt or damage the individual contact. High resistance at a signal contact may distort or attenuate the signal, leading to rejection of acceptable IC packages 14. I find that force per contact in the range mentioned above usually provides consistent and constant electrical connection between the grid 14 contacts and the test contacts.

I have found that the large temperature swings an IC undergoes during test can greatly affect the pressures for grid 14 contacts if a compliant or resilient element is not interposed in the linkage that applies the force to IC surface 11. The designed-in preload force provided by springs 35a, 35b, 35c results in relatively constant force during a test procedure even if the IC 10 produces large amounts of heat that warm it and adjacent parts of the test fixture 20 causing slight dimensional changes in fixture 20 components and IC 10.

Test fixture 20 can have a number of possible variations. For example, the number of springs 35a, 35b, 35c can be varied as a matter of design choice or to control the value for $F_r$. The means for retaining float 38 against the force of springs 35a, 35b, 35c can be varied. Alternatives to coil springs are possible, such as leaf springs or Belleville washers.

At the present time, I do not prefer to use an elastomeric material as a resilient element because the resiliency of those with which I am familiar changes with temperature. However, elastomeric materials whose resiliency is not affected by temperature changes may be suitable. All of these suitable resilient components and materials and others not mentioned as well can be subsumed under the term "resilient element" for purposes of defining the invention.

One significant variation results in an alternative design for actuator 30 that falls directly within the spirit of my invention. This variation eliminates the Z axis translation degree of freedom for the gimbaled mount for float 38. Therefore a simplified version of this invention might have only two rotational degrees of freedom for float 38 motion. However, I believe that maintaining suitable pressure on the grid 14 contacts may be more difficult without using a gimbaled mount with Z axis translation.

While IC package 10 is shown as having ball grid array contacts, this invention can also be modified for other IC package types. FIG. 6 shows a SO (small outline) package IC 70. Two rows of leads 73 project from a bottom surface of SO IC 70. Leads 73 can project either downwardly as shown, or laterally. Where the leads 73 project downwardly, a float 77 having a single degree of freedom and pressing on the SO IC 70 may be sufficient. Force may be applied by a spindle through a pin passing through hole 79, allowing a single degree of rotational freedom for float 77 for the gimbaled mount. Of course, a second degree of freedom, Z axis translation, may be desirable. The float surface contacting the SO IC 70 should conform to the top surface of SO IC 70.

Should contacts 73 project laterally, as in some IC devices, these leads may not have enough stiffness to apply force forming an adequate electrical contact with test contacts. In this case, float 77 may press directly on such laterally extending pins. In this arrangement, a single degree of rotational freedom may again be sufficient to apply adequate and controllable force to each of the contacts 73. The float 77 surface pressing on the pins should in this case conform to the surface collectively defined by individual leads. Of course, such a float 77 must have an insulating surface so as not to short the contacts.

On the other hand, more than three degrees of freedom of movement for float 38 may sometimes be desirable. Such an arrangement may allow for better alignment of the test contacts with grid 14.

I may find as I gain experience with this invention, that float 38 will be better left unloaded by springs 35a, 35b, 35c until test fixture 20 has been closed and actuator 30 deployment begins. For example, a restraint may be provided that limits spring 35a, 35b, 35c extension into contact with float 38 until knob 28 has been rotated a preselected amount during a deployment process. This restraint can then more gently and accurately apply spring 35a, 35b, 35c force to float 38. Such a mechanism may reduce the chance that force or torque applied by float 38 to package 10 will skew or otherwise affect the alignment of grid 14 with the test contacts.

Many other design variations are possible that still fall within the spirit of this invention. All of these variations are intended to be included in the claims below which define the invention.

What is claimed is:

1. An actuator for use with an IC test fixture for pressing against test contacts, the contacts of an IC package having a predetermined geometry, said actuator comprising a base element and a float having a presser surface which conforms with a predetermined feature of the IC package, said actuator having mounting means for mounting said float on said base such that said presser surface is opposite said base, with said mounting means having a plurality of resilient elements distributed across the surface which urges the float away from the base element, said resilient elements being arranged to provide the presser surface of said float with two degrees of rotational freedom.

2. The actuator of claim 1, wherein said mounting means also provides a translational degree of freedom, said translational degree of freedom having a resilient bias presenting a predetermined preload force to the presser surface.

3. The actuator of claim 2, wherein the presser surface is a flat plate.

4. The actuator of claim 1, wherein the resilient elements of said mounting means comprises a plurality of compression springs mounted between the float and the base element.

5. The actuator of claim 4, wherein said springs provide two rotational degrees of freedom and one translational degree of freedom.

6. The actuator of claim 5, including a retainer attached to the base element and cooperating with the springs to bias the float to a predetermined position with respect to the base element.

7. The actuator of claim 6, wherein the springs provide a bias creating a predetermined preload force available at the presser surface.

8. The actuator of claim 7, including a stop element carried on the base element and limiting translation of the base element along the translational degree of freedom.

9. The actuator of claim 8, wherein the stop element forms a part of the retainer.

10. The actuator of claim 5, including a stop element carried on the base element and limiting translation of the base element along the translational degree of freedom.

11. The actuator of claim 2, including a stop element carried on the base element and limiting translation of the base element along the translational degree of freedom.

12. The actuator of claim 2, including a stop element carried on the base element and limiting translation of the base element along the translational degree of freedom, said stop element adjustable to limit translation, and wherein the resilient elements of said mounting means comprises a plurality of springs mounted between the float and the base element.

* * * * *